United States Patent [19]

Fukushima

[11] Patent Number: 5,389,926
[45] Date of Patent: Feb. 14, 1995

[54] MICROCOMPUTER HAVING TEST CIRCUIT FOR A/D CONVERTER

[75] Inventor: Kiyoshi Fukushima, Kumamoto, Japan

[73] Assignee: NEC Corporation, Tokyo, Japan

[21] Appl. No.: 92,360

[22] Filed: Jul. 15, 1993

[30] Foreign Application Priority Data

Jul. 17, 1992 [JP] Japan .................................. 4-190554

[51] Int. Cl.[6] ............................................. H03M 1/10
[52] U.S. Cl. .................................. 341/120; 341/141; 341/155; 341/172
[58] Field of Search ............... 341/118, 119, 120, 121, 341/141, 150, 155, 172

[56] References Cited

U.S. PATENT DOCUMENTS

| | | | |
|---|---|---|---|
| 4,517,549 | 5/1985 | Tsukakoshi | 341/172 |
| 4,599,604 | 7/1986 | McKenzie et al. | 341/120 |
| 4,611,195 | 9/1986 | Shosaku | 341/150 |
| 4,908,620 | 3/1990 | Fujisawa et al. | 341/172 |
| 5,016,014 | 5/1991 | Bitting | 341/172 |
| 5,175,547 | 12/1992 | Lyon et al. | 341/120 |
| 5,185,607 | 12/1992 | Lyon et al. | 341/120 |

*Primary Examiner*—Howard L. Williams
*Attorney, Agent, or Firm*—Whitham, Curtis, Whitham & McGinn

[57] ABSTRACT

Disclosed herein is a microcomputer having a test circuit for an A/D converter of a C/R type. This converter includes a resistor circuit having a plurality of resistors connected in series between reference potential points to generate a changeable reference voltage and a capacitor circuit having a plurality of capacitors for storing electrical charges relative to an analog input voltage and to the changeable reference voltage, and the test circuit is coupled to the resistor circuit and the capacitor circuit and further to first and second terminals and activated in a test mode to transfer the changeable reference voltage to the first terminal and another reference voltage, which is produced outside the microcomputer, to the capacitor circuit.

8 Claims, 4 Drawing Sheets

MICROCOMPUTER HAVING TEST CIRCUIT FOR A/D CONVERTER

BACKGROUND OF THE INVENTION

The present invention relates to a single chip microcomputer and, more particularly, to such a microcomputer having an analog-to-digital (A/D) converter of a capacitor/resistor (C/R) type as one of peripheral units.

Aa well known in the art, a single chip microcomputer includes, on a single semiconductor chip, a program memory storing a string of instructions for a program, a data memory storing operand data, a central processing unit (CPU) performing a data processing operation on the operand data stored in the data memory in accordance with the instruction read out from the program memory, and a plurality of peripheral units such as an A/D converter, a digital-to-analog converter, a serial data communication unit and a timer/counter. Although a various types of A/D converters are known in the art, an A/D converter of a C/R type has been put into practical use as a peripheral unit of the microcomputer. The A/D converter of this type includes a capacitor circuit for generating more (or less) significant bits of digital data corresponding to an analog input signal and a resistor circuit for generating less (or more) significant bits of the digital data.

Referring to FIG. 1, a microcomputer according to prior art includes a CPU 101 and an A/D converter 100 of the C/R type which are interconnected through an internal bus 107. The converter 100 includes a sequence controller 102, a capacitor circuit 103, a resistor circuit 104 and a comparator 106. The sequence controller 102 receives control data from and supplies converter digital data to the CPU 101 via the bus 107. The capacitor circuit 103 is supplied with an analog input signal Aid via a signal line 110 and coupled to the controller 102 via a control signal bus 108 to control electrical charges to be stored in capacitors (see FIG. 2). The output voltage from the capacitor circuit 103 appears on a line 114. The resistor circuit 104 is coupled to the controller 102 via a control signal bus 109 to generate and supply a selected voltage to the capacitor circuit 103 through a line 116. The comparator 106 compares the output voltage on the line 114 with a reference voltage VA on a line 113.

Referring to FIG. 2, the capacitor circuit 103 includes three capacitors 605–607 and four switch circuits 601–604 which are connected as shown. The capacitance ratio of the capacitors 605, 606 and 607 is 1:1:2. The switch circuit 601 connects the lines 113 and 114 to each other when the control data on a control signal line 608 of the control bus 108 assumes the high level and disconnects them from each other when the control data assumes the low level. The high level of the control data on the line 608 further causes the switch circuits 602, 603 and 604 to connect the analog input line 110 to the respective one ends of the capacitors 605, 606 and 607. When the control data 608 is at the low level, on the other hand, the line 116 is connected to the one end of the capacitor 605 through the switch 602. As to the switch circuits 603 and 604, the switch circuit 603 connects the one end of the capacitor 606 to the analog ground voltage AVss when both of the control data 608 and 610 of the control data bus 108 assume the low level and to another reference voltage Vref when the control data 608 and 610 assume the low level and the high level, respectively. The switch circuit 604 connects the one end of the capacitor 604 to the analog voltage AVss when both of the control data 608 and 609 take the low level and to the reference voltage Vref when the control data 608 and 609 take the low level and the high level, respectively.

Turning to FIG. 3, the resistor circuit 104 includes a plurality of resistors 707–711 connected in series between the reference voltage Vref and the analog ground AVss and a plurality of transfer gates 701–706. Each of the transfer gates 701–706 is connected between the different one of the connection nodes of the resistors 707–711 and the voltage output line 116. The conductive and nonconductive states of transfer gates 701–706 are controlled by the corresponding control data 712–717 of the control bus 109.

In operation, the CPU 101 supplies the conversion control data to the sequence controller 102 via the internal bus 107 to command the conversion operation. In response thereto, the controller 102 initiates first a sampling operation in which the control data 608 is changed to the high level to cause the switch circuit 601 to connect the lines 113 and 114 to each other. The switch circuits 602–604 connects the analog input line 110 to the respective one ends of the capacitors 605–607. Consequently, the capacitors 605–607 receive the analog input signal Aid at the respective one ends thereof and the reference voltage VA at the respective other end thereof, and store the voltage difference therebetween.

Subsequently, an conversion operation is initiated to change the control data 608 to the low level. The switch circuit 601 is thereby tuned OFF and the switch circuit 602 connects the lines 116 and 611 to each other. In a first step, the control data 609 and 610 are brought into the high level and low level, respectively. The switch circuit 604 supplies the reference voltage Vref to the one end of the capacitor 607. The electrical charges stored in the capacitors 605–607 are thereby increased to push up the voltage on the line 114. The comparator 106 compares the voltage on the line 114 thus push up with the voltage VA and supplies the comparison result to the controller 102. The output of the comparator 106 indicates the most significant bit data of the converted digital data. The logic level of the control data 609 is thereby determined.

In a next step, The control data 610 is changed to the high level to cause the switch circuit 603 to supply the reference voltage Vref to the one end of the capacitor 606. The electrical charges stored in the capacitors 605–607 are thereby increased to rise the voltage of the line 114. The comparator 106 outputs the comparison data which represents the next most significant bit data of the converted digital data. Thus, the capacitor circuit 103 generates the most significant two bit data of the converted digital data.

The remaining bit data of the converted digital data are derived by the resistor circuit 104. More specifically, one of the transfer gates 701–706 is turned ON such that the voltage on the line 116 takes the intermediate level of the reference voltage Vref. The electrical charges stored in the capacitors 605–607 are thereby increased in accordance with the voltage on the line 116 and the capacitance of the capacitor 605. The output of the comparator 106 thus indicates the third most significant bit data of the converted digital data. In a similar manner, one of the transfer gates 701–706 to be turned ON is controlled to obtain the remaining bit data of the converted digital data. The digital data thus converted is supplied to the CPU 101 from the sequence controller 101 through the internal bus 107.

As apparent from the above description, the conversion accuracy is dependent on the actual values of each of the capacitors 605–607 and resistors 707–711. Accordingly, it is desirable to check whether each of the capacitors 605–607 and resistors 707–711 is within the tolerant range. It is further required to check the capacitor circuit and the resistor circuit independently of each other.

SUMMARY OF THE INVENTION

It is therefore an object of the present invention to provide a microcomputer having a test circuit for an A/D converter of a C/R type.

It is another object of the present invention to provide a test circuit for an A/D converter of a C/R type incorporated into a single chip microcomputer to test a capacitor circuit and a resistor circuit independently of each other.

A microcomputer according to the present invention comprises a CPU, an A/D converter interconnected to the CPU via an internal bus and having a first circuit section which has a function of generating a changeable reference voltage at an output node thereof and a second circuit section which has a function of receiving the changeable reference voltage at an input node thereof and storing a voltage difference between the changeable reference voltage and an analog input voltage, a first terminal, a second terminal, and a test circuit coupled to the A/D converter and the first and second terminals and operable in a test mode to connect the first terminal to the output node of the first circuit section of the A/D converter and the second terminal to the input node of the second circuit section of the A/D converter.

With such an arrangement, in the test mode, the changeable reference voltage is outputted to the first terminal, so that this changeable reference voltage can be monitored to check whether the first circuit section generates that voltage within the tolerant range. Further in the test mode, since the second terminal is connected to the second terminal, an accurate reference voltage can be supplied from the cutside of the microcomputer to the second circuit section to check the operation thereof.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

Figure 1:
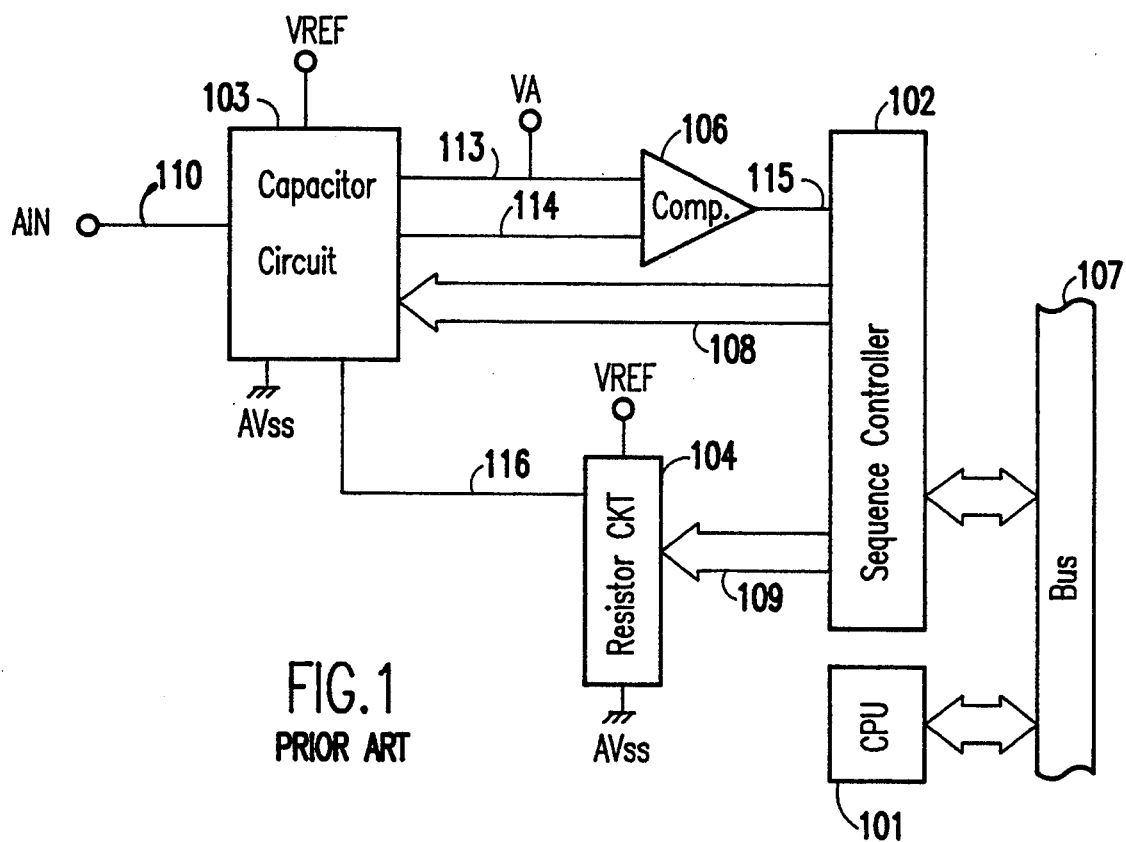
FIG. 1 is block diagram illustrative of a microcomputer according to the prior art.
Figure 4:
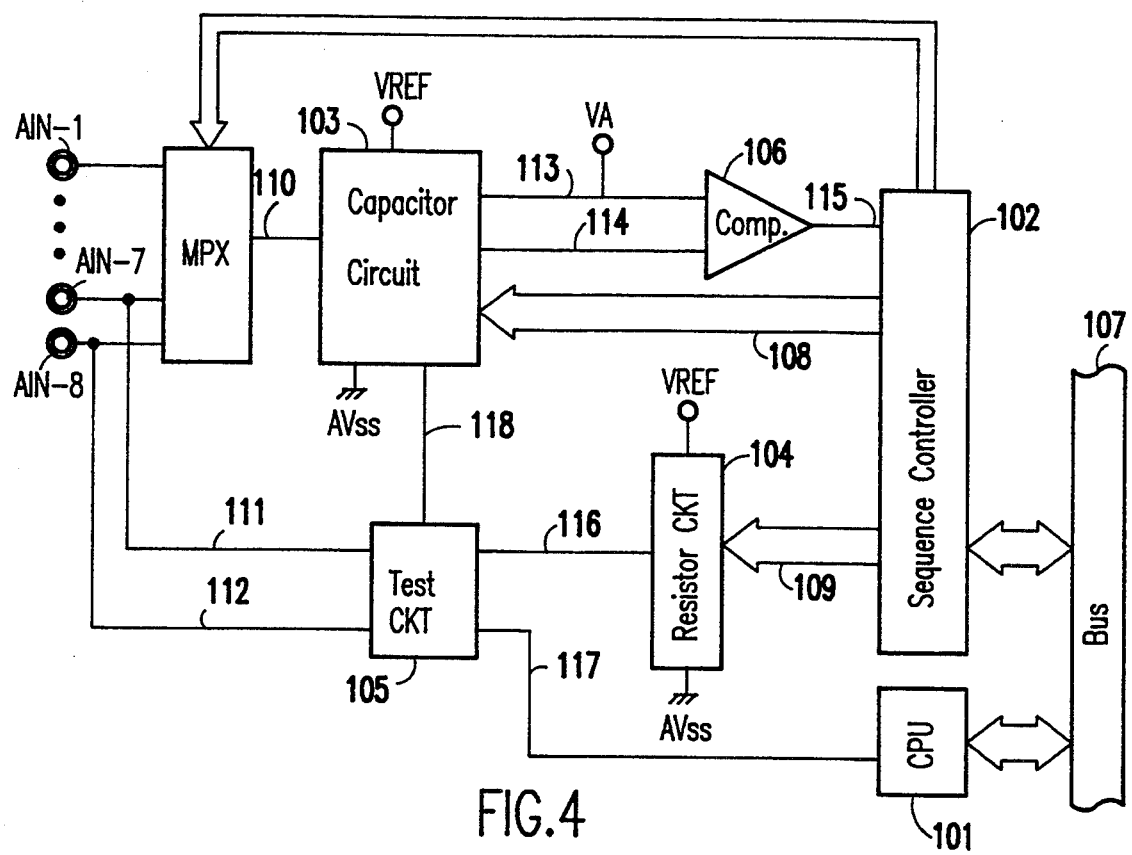
FIG. 4 is block diagram illustrative of a microcomputer according to a first embodiment of the present invention.

Referring to FIG. 4, there is shown a microcomputer according to a first embodiment of the present invention in which the same constituents as those shown in FIG. 1 are denoted by the same reference numerals to omit the further description thereof. In this microcomputer, there is provided a test circuit 105 and the signal 116 from the resistor circuit 104 is connected to the test circuit 105, not connected directly to the capacitor circuit 103. A signal line 118 is lead out from the test circuit 105 and connected to the capacitor circuit 103. The capacitor circuit 103 has the same construction as that shown in FIG. 2, and therefore, the signal line 116 is replaced with the line 118 in the present microcomputer. The test circuit 105 further has two signal lines 111 and 112, one of which is used to receive and output the reference voltage from the resistor circuit 104 to the outside of the microcomputer and the other of which is used to receive and supply a variable reference voltage from the outside of the microcomputer to the capacitor circuit 103. The test circuit 105 ia activated by a test mode signal supplied form the CPU 101 through a signal line 117.

In order to reduce the number of external terminals or pins required as the single chip microcomputer, the signal lines 116 and 117 are connected respectively to the seventh and eighth analog input terminals Aid-7 and Aid-8 of eight analog input terminals Aid-1 to Aid-8. These analog input terminals Aid-1 and Aid-8 are connected to a multiplexor (MPX) 130, and one of them is selected by the MPX 130 in accordance with selection data 131 from the sequence controller 102. The selection data 131 is produced by the command from the CPU 101.

Figure 5:
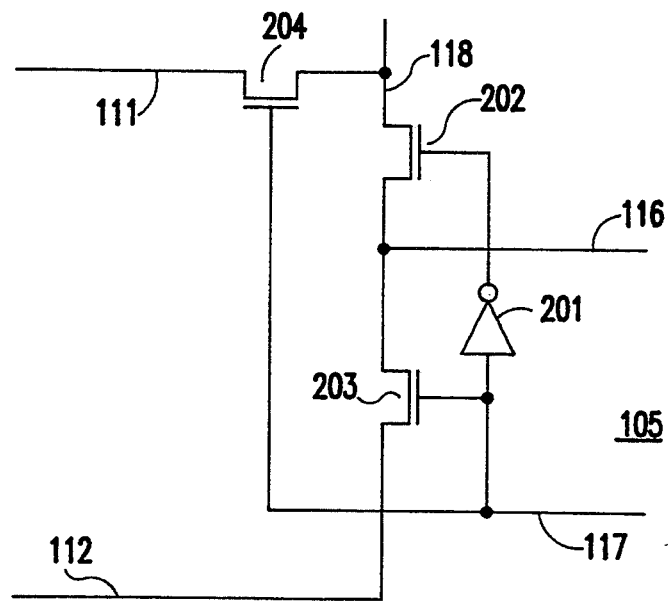
FIG. 5 is a circuit diagram illustrative of a test circuit shown in FIG. 4.

Turning to FIG. 5, the test circuit 105 includes three transfer gates 202–204 and an invertor 201 which are connected as shown. When the test mode signal takes the active high level to indicate the test mode, the transfer gates 203 and 204 are turned ON, whereas the transfer gate 202 is turned OFF. The signal lines 116 and 118 are thereby connected to the signal lines 112 and 11, respectively. In a normal operation mode, on the other hand, the signal 117 takes the inactive low level to turn the transfer gate 202 ON and the gates 203 and 204 OFF. The signal line 116 is thus connected to the line 118.

Figure 2:
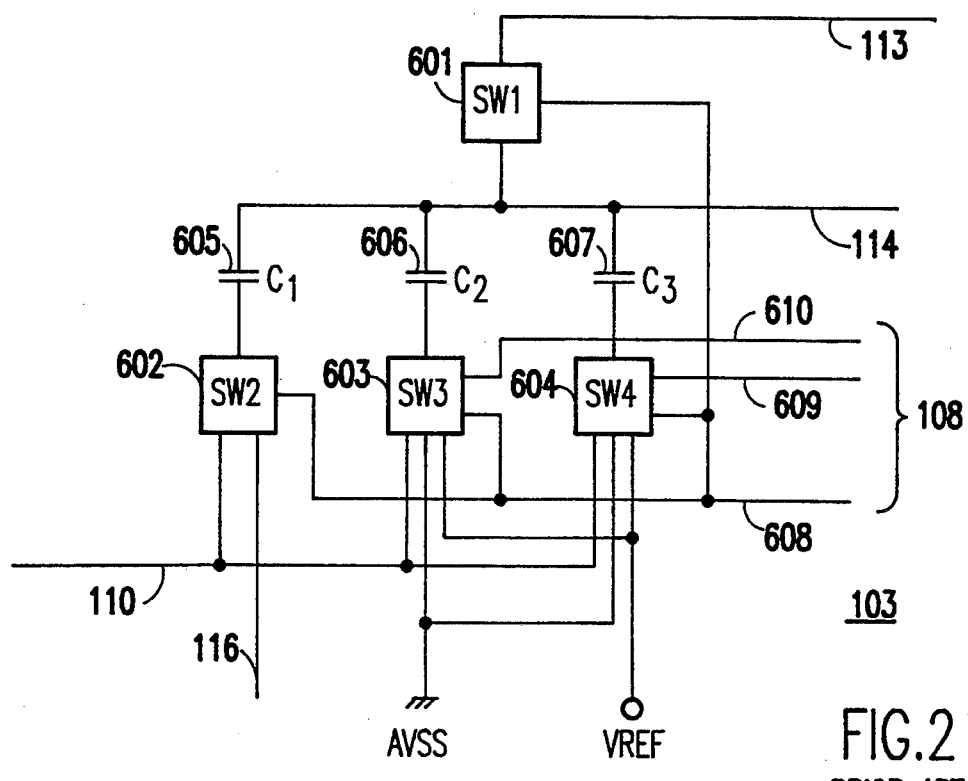
FIG. 2 is circuit diagram illustrative of a capacitor circuit shown in FIG. 1.
Figure 3:
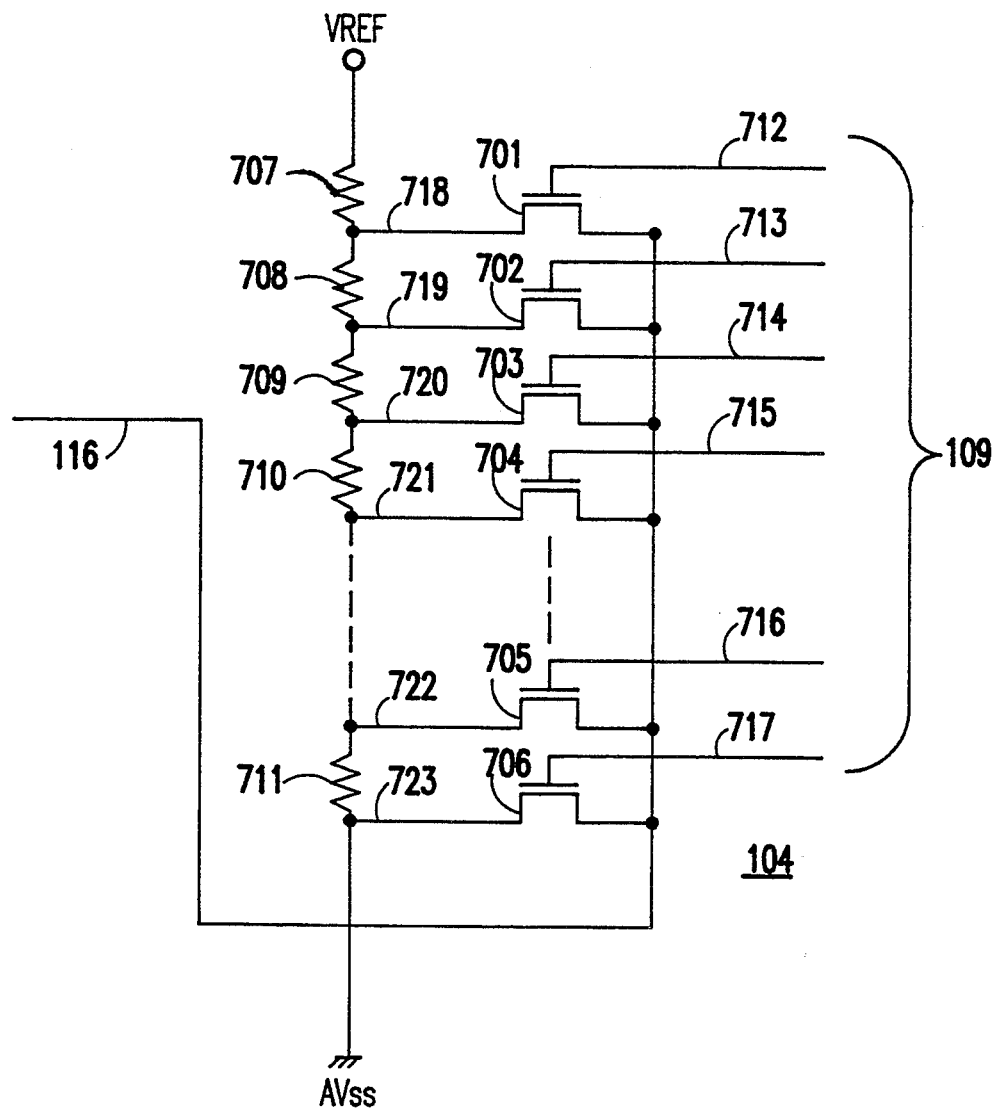
FIG. 3 is circuit diagram illustrative of a resistor circuit shown in FIG. 1.

In a normal operation, the test circuit 105 is deactivated, so that one of the analog input voltage Aid-1 to Aid-8 is selected and converted into the corresponding digital data in the same manner as described with reference to FIGS. 1–3. In the test mode, on the other hand, the CPU 101 changes the test mode signal 117 to the active high level, so that the signal line 116 is electrically connected to the terminal Aid-8 and the signal line 118 is electrically connected to the terminal Aid-7. In this state, the sequence controller 102 turns the transfer gates 701–706 (see FIG. 3) ON in sequence. The reference voltages at the respective nodes of the resistors (FIG. 7) appears on the terminal Aid-8 and monitored whether each of them is within the tolerable range. On the other hand, the terminal Aid-7 receives the variable reference voltage from the outside of the microcomputer, that voltage being in turn supplied to the capacitor circuit 103 via the signal line 118. At this time, the converter 100 is in a operable state, so that the converted digital data corresponding to the analog input voltage supplied to, for example, the terminal Aid-1 is produced and supplied to the outside of the microcomputer from an output port (not shown). The capacitor circuit 103 is thus checked whether the operation thereof is correct.

Figure 6:
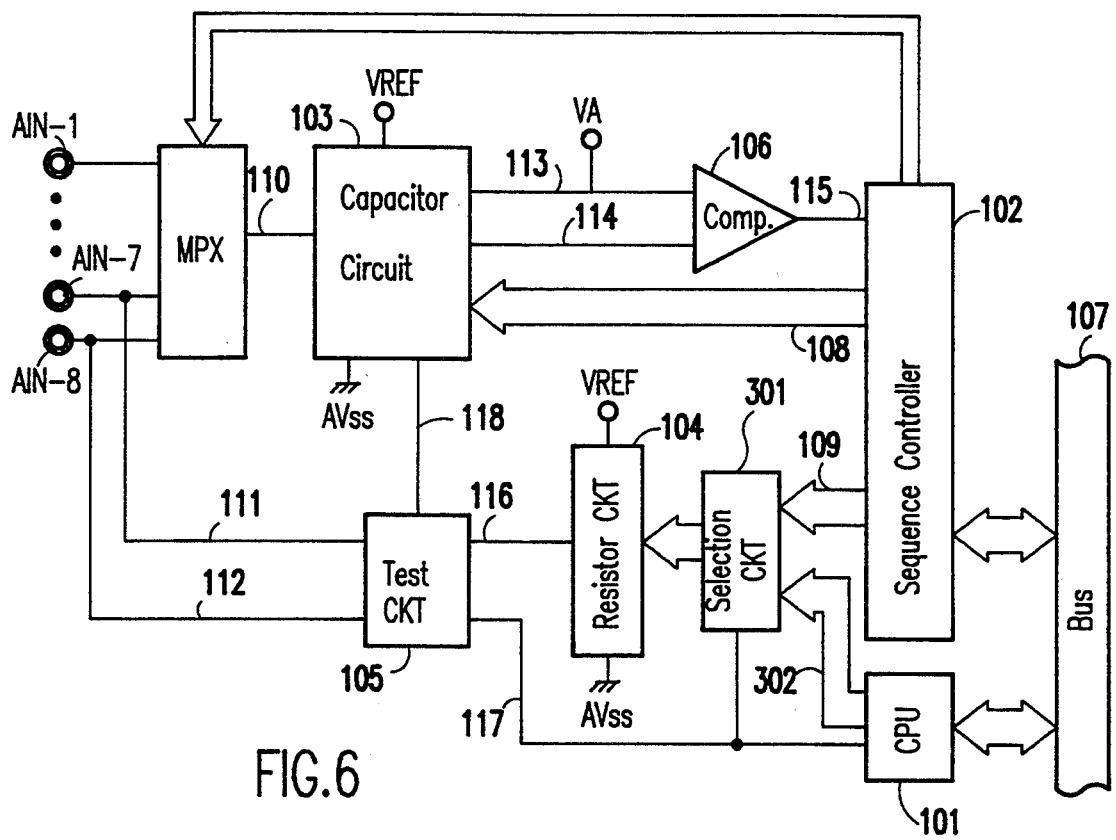
FIG. 6 is block diagram illustrative of a microcomputer according to a second embodiment of the present invention.

Referring to FIG. 6, the microcomputer according to a second embodiment of the present invention further includes a selection circuit 301 in addition to the constituents shown in FIG. 4. This selection circuit 301 selects the control data 109 from the sequence controller 102 when the mode signal 117 takes the low level to indicate the normal operation mode and control data 302 from the CPU 101 when the signal 117 takes the high level to indicate the test mode.

Figure 7:
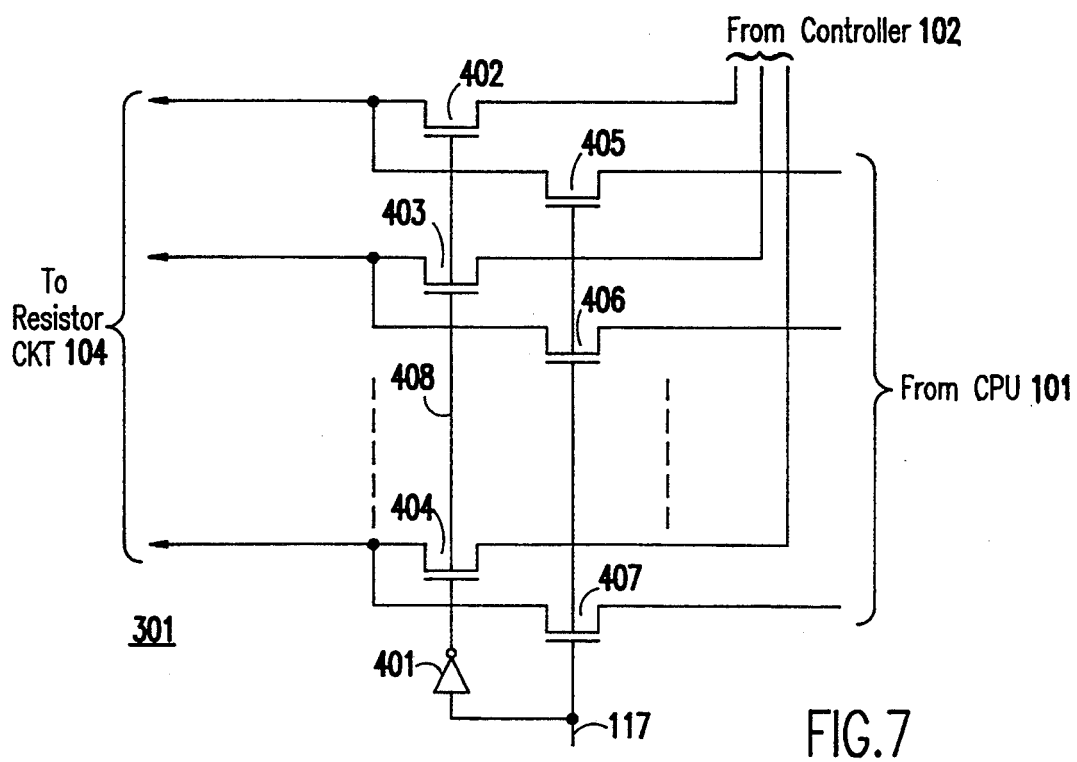
FIG. 7 is a circuit diagram illustrative of selector circuit shown in FIG. 6.

Turning to FIG. 7, the selection circuit 301 includes a first set of transfer gates 402-404 which are activated in the normal operation mode and a second set of transfer gates 405-407 which are activated in the test mode. An invertor 401 control the transfer gates 402-404 and 405-407 in response to the test mode signal 117.

With such a circuit arrangement, the desired one of the transfer gates 701-706 (FIG. 3) is turned ON by the data from the CPU 101. The test for the resistor circuit 104 can be thereby shortened.

It is apparent that the present invention is not limited to the above embodiments but may be modified and changed without departing form the scope and spirit of the invention. For example, The present invention is applicable to such an A/D converter that has a capacitor circuit which generates less significant bits data of the converted digital data and a resistor circuit which generates more significant bits data thereof. The capacitor circuit may generate three or more bits data of the converted digital data. The signal lines 111 and 112 are connectable to other terminals such as input and/or output port pins.

What is claimed is:

1. A microcomputer comprising a central processing unit, an analog-to-digital converter coupled to said central processing unit via an internal bus and converting an analog input voltage supplied thereto to corresponding digital data, said analog-to-digital converter including a first circuit section which has a function of generating a changeable reference voltage at an output node thereof and a second circuit section which has a function of receiving said changeable reference voltage at an input node thereof and storing an electrical charges relative to said changeable reference voltage, first and second terminal, and a test circuit coupled to said analog-to-digital converter and said first and second terminals and activated in a test mode to connect said output node of said first circuit section to said first terminal and said input node of said second circuit section to said second terminal.

2. The microcomputer as claimed in claim 1, wherein said first circuit section comprises a resistor circuit including a plurality of resistors connected in series between first and second potential points and a plurality of transfer switches each connected between a different one of connection nodes of said resistors and said output node, and said second circuit section comprises a capacitor circuit including at least one series circuit of a capacitor and a switch circuit, said series circuit being connected to receive said changeable reference voltage.

3. The microcomputer as claimed in claim 2, wherein said analog-to-digital converter further includes a sequence controller supplying first control data to said transfer switches to activate one of said transfer switches to control a value of said changeable reference voltage.

4. The microcomputer as claimed in claim 3, further comprising a selection circuit coupled to said sequence controller, said central processing unit and said transfer switches, said central processing unit producing a second control data, said selection circuit selecting and supplying said first control data to said transfer switches in a normal operation mode and selecting and supplying said second control data to said transfer switches in said test mode.

5. The microcomputer as claimed in claim 1, wherein said test circuit includes a first transfer gate connected between said output node and said input node, a second transfer gate connected between said output node and said first terminal and a third transfer gate connected between said input node and said second terminal, said first transfer gate being made open in a normal mode and said second and third transfer gates being made open in said test mode.

6. A microcomputer comprising a central processing unit, an analog-to-digital converter coupled to said central processing unit, a plurality of analog input terminals each supplied with an analog input voltage, said analog-to-digital converter selecting one of said analog input terminals and converts the analog input voltage supplied to the selected analog input terminal to generate corresponding digital data, said analog-to-digital converter including a first circuit for producing a variable reference voltage used for converting the analog input voltage, and a test circuit coupled between one of said analog input terminals and said first circuit of said analog-to-digital circuit and activated in a test mode to transfer said variable reference voltage to said one of said analog input terminal.

7. The microcomputer as claimed in claim 6, wherein said analog-to-digital converter further includes a second circuit which produce a part of said corresponding digital data in response to said variable reference voltage, and said test circuit is further coupled between said second circuit and another one of said analog input terminals to form an electrical path therebetween in said test mode.

8. The microcomputer as claimed in claim 7, wherein said first circuit comprises a resistor circuit and said second circuit comprises a capacitor circuit.

* * * * *